United States Patent [19]
Oda

[11] Patent Number: 5,888,042
[45] Date of Patent: Mar. 30, 1999

[54] SEMICONDUCTOR WAFER TRANSPORTER

[75] Inventor: Tatehumi Oda, Aichi, Japan

[73] Assignee: Nidek Co., Ltd., Aichi, Japan

[21] Appl. No.: 892,225

[22] Filed: Jul. 14, 1997

[30] Foreign Application Priority Data

Oct. 3, 1996 [JP] Japan ................................. 8-283279

[51] Int. Cl.⁶ .................................................. B65H 3/00
[52] U.S. Cl. ........................... 414/222; 414/416; 414/937
[58] Field of Search .................................... 414/222, 937, 414/416, 223, 331

[56] References Cited

U.S. PATENT DOCUMENTS

| | | | |
|---|---|---|---|
| 4,501,527 | 2/1985 | Jacoby et al. | 414/937 X |
| 4,770,590 | 9/1988 | Hugues et al. | 414/937 X |
| 5,664,926 | 9/1997 | Sussman et al. | 414/937 X |

FOREIGN PATENT DOCUMENTS

| | | | |
|---|---|---|---|
| 2-291144 | 11/1990 | Japan | H01L 21/68 |
| 2-292196 | 12/1990 | Japan | B25J 15/06 |
| 6-127621 | 5/1994 | Japan | 414/937 |

*Primary Examiner*—Donald W. Underwood
*Attorney, Agent, or Firm*—Sughrue, Mion, Zinn, Macpeak & Seas, PLLC

[57] ABSTRACT

A semiconductor wafer transporter includes a transport mechanism for taking out a wafer from a carrier storing a large number of semiconductor wafers and transporting the wafer to a processor for performing visual inspection, patterning, etc. The carrier is placed in a predetermined orientation and then a wafer outlet of the carrier is rotated so as to face the transport mechanism. The carrier can be installed and removed safely and easily without complicating a transport mechanism.

14 Claims, 4 Drawing Sheets

SEMICONDUCTOR WAFER TRANSPORTER

BACKGROUND OF THE INVENTION

This invention relates to a semiconductor wafer transporter for transporting a wafer between a carrier for storing semiconductor wafers and a processor for performing wafer inspection, examination, working, etc.

When visual inspection, patterning, etc. is performed for a semiconductor wafer, a semiconductor wafer transporter is generally used. The semiconductor wafer transporter includes: a carrier placement bed (tray) for placing thereon a carrier in which a large number of wafers are stored; and a transport mechanism for taking out a wafer from the carrier placed on the placement bed and transporting the wafer to the processor for performing inspection, patterning, etc. In this type of transporter, the carrier is placed so that a wafer outlet faces the transport mechanism such as air tweezers, etc.

In a small-sized transporter for use with macro inspection and microscopic examination of wafers, a carrier has a wafer outlet which faces the operator or which is directed laterally with respect to the operator in order to efficiently transport wafers to an inspection instrument placed immediately before the examiner and in order to make a transport mechanism small in size as much as possible.

By the way, with recent development in wafer manufacturing technology, the wafer size has become large in diameter. As the diameter grows, the carrier storing a large number of wafers is also upsized and increases in weight. Thus, when placing the carrier on a placement bed, normally the operator holds both side faces of the carrier with both hands. However, with the device having a wafer outlet directed laterally, the carrier must be placed thereon with the wafer outlet turned; this handling increases the risk of dropping a wafer. Further, it is hard for the operator to hold the carrier with both hands and direct the wafer outlet laterally.

To place the carrier on the placement bed most safely and easily, the wafer outlet should be made to face away from the operator. However, if the transporter is designed so that the wafer outlet away from the operator, the transport mechanism for transporting a wafer to an inspection instrument placed immediately before the examiner becomes complicated, and the whole transporter becomes upsized. The transporter also becomes expensive.

SUMMARY OF THE INVENTION

It is therefore an object of the invention to provide a semiconductor wafer transporter which enables safe and easy placement of a carrier without complicating a transport mechanism and which can be miniaturized.

To achieve the above-noted and other objects, the invention provides the following arrangements:

(1) A semiconductor wafer transporter comprises: transport means for taking out a wafer from a carrier storing a large number of semiconductor wafers and transporting the wafer to a processor for performing visual inspection, patterning, etc.; placement means for placing the carrier in a predetermined orientation; and rotating means for rotating a wafer outlet of the carrier so as to face the transport means.

(2) The semiconductor wafer transporter having the above-noted arrangement (1) further includes fixing means for inhibiting rotation of the placement means.

(3) The fixing means of the above-noted arrangement (2) inhibits rotation of the placement means at two positions, i.e. a position where the carrier is placed and a position where a wafer is taken out by the transport means.

(4) The semiconductor wafer transporter having the above-noted arrangement (2) further includes sensing means for sensing a fixing state of the placement means by the fixing means.

(5) The semiconductor wafer transporter having the above-noted arrangement (1) further includes moving means for moving the carrier up and down, wherein the fixing means can be released when the carrier is placed at a predetermined height position.

(6) In the semiconductor wafer transporter having the above-noted arrangement (1), the placement means places the carrier with the wafer outlet of the carrier directed away from the operator.

(7) The semiconductor wafer transporter in any of the above-noted arrangements (1)–(6) is a wafer inspection instrument having examination means for executing a visual inspection.

DETAILED DESCRIPTION OF THE PREFERRED EMBODIMENT

Figure 1:
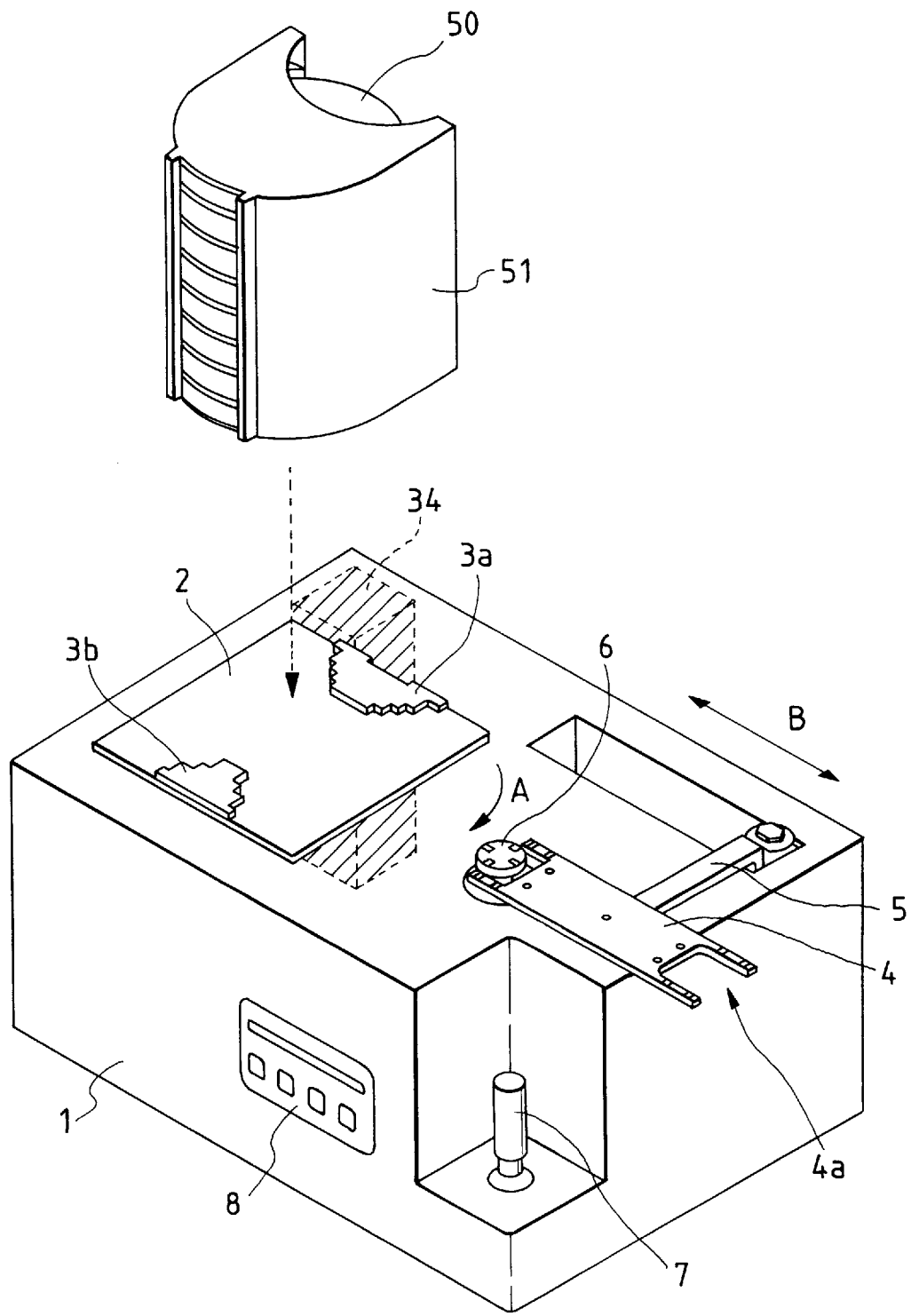
FIG. 1 is a schematic diagram of the appearance of a semiconductor wafer transporter of an embodiment of the invention.
Figure 2:
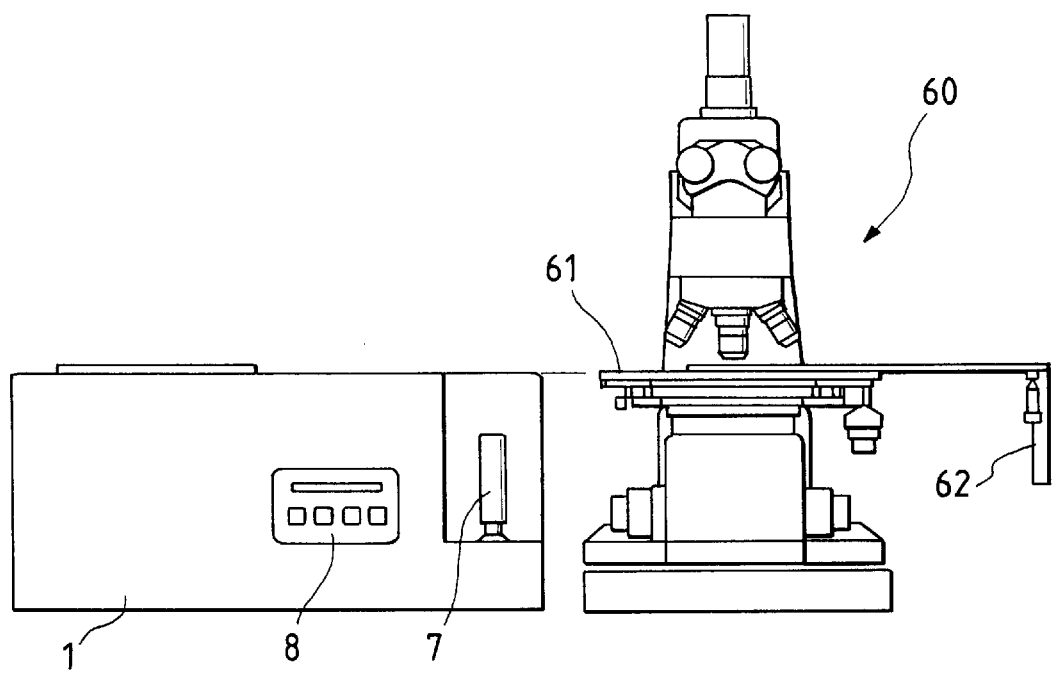
FIG. 2 is a front view when the semiconductor wafer transporter of the embodiment and a microscope are used in combination.

An embodiment of the present invention is described in detail below with reference to the drawings. FIG. 1 is a schematic diagram of appearance of a semiconductor wafer transporter comprising a macro stage for macro inspection. FIG. 2 is a front view when the transporter of the embodiment and a microscope are used in combination.

In FIG. 1, numeral 1 is a transporter main unit and numeral 2 is a carrier placement bed for placing thereon a carrier 51 in which a large number of semiconductor wafers 50 are stored. Fixing members 3a and 3b for positioning and fixing the carrier 51 are fixedly secured on the top of the placement bed 2. The placement bed 2 is rotated 90 degrees in the arrow A direction from the state shown in FIG. 1 by a rotation mechanism (described later in detail) so that a wafer outlet of the carrier 51 is directed toward the position of air tweezers or a pick-up element 4. The placement bed 2 is moved up and down by a loader mechanism 34 in the main unit, and the wafers 50 stored on shelves (one wafer on one shelf) in the carrier 51 are taken out or stored with the pick-up element 4.

The pick-up element 4 is provided at each end with an attraction part 4a substantially in the form of U-shape which has a plurality of attraction holes for preventing the wafer 50 from dropping. These holes communicate through an interior of the pick-up element 4, a vacuum tube, a solenoid valve, etc., with an attraction device. The pick-up element 4 is moved left and right (in the arrow B direction) through a moving arm by a moving mechanism installed inside the transporter. A wafer 50 stored within the carrier 51 is attracted onto one of the attraction parts 4a, and transported to a macro stage 6. In a placement face of the macro stage 6, there are provided a plurality of attraction holes communicating with the attraction device similarly to the pick-up element 4 so as to attract and hold the wafer 50. After the wafer 50 has been placed on the macro stage 6, the macro stage 6 is moved upwardly, and in response to an operation signal from a joy stick 7 the macro stage 6 is rocked and inclined for macro inspection of the wafer 50.

The pick-up element 4 is designed to pivot about its center, and can transfer the wafer 50 to a microscope 60 shown in FIG. 2. The microscope 60 is provided with an examination stage 61, and the wafer 50 is placed under the microscope 60 with a handle 62 for a microscopic examination. Numeral 8 is an operation panel provided with various switches.

Figure 3A:
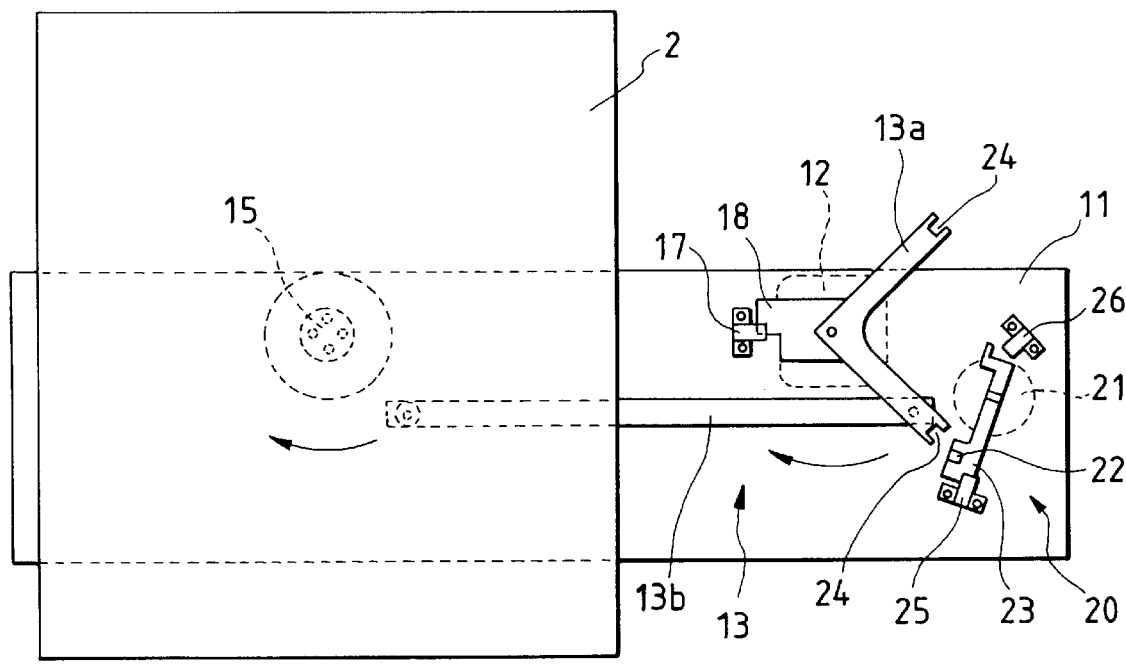
FIGS. 3(a) and 3(b) are illustrations of a rotation mechanism and a stopper mechanism of a carrier placement bed.
Figure 3B:
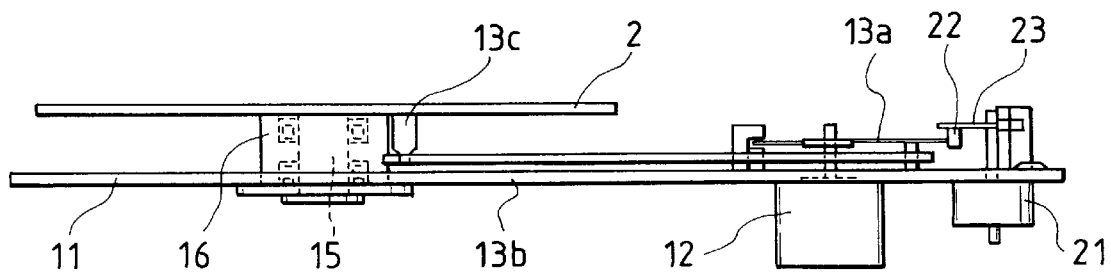

FIGS. 3(a) and 3(b) are top and side views to explain a rotation mechanism and a stopper mechanism for the carrier placement bed 2.

(Rotation mechanism)

A rotation shaft 15 is fixedly secured to the center of the placement bed 2; it is held rotatably on a base 11 via a bearing 16. Numeral 12 is a pulse motor for rotating the placement bed 2. A substantially L-shaped rocker arm 13a is attached to a rotation shaft of the pulse motor 12. The rocker arm 13a is commonly used in the rotation mechanism and the stopper mechanism. One of arm parts of the rocker arm 13a is rotatably coupled to one end of a connecting link 13b, and the other end of the connecting link 13b is coupled to the placement bed 2 through a rotatable link receiving part 13c. The rocker arm 13a, the connecting link 13b, and the link receiving part 13c constitutes a link mechanism 13 in this embodiment. When the pulse motor 12 receives a predetermined pulse signal and is rotated in response thereto, the rotation is transmitted to the placement bed 2 through the link mechanism 13, and the placement bed 2 is thus rotated at 90 degrees about an axis of the rotation shaft 15 with the aid of the bearing 16.

Numeral 17 is a light shield sensor and numeral 18 is a light shielding plate attached to the rotation shaft of the pulse motor 12. The light shield sensor 17 detects the initial angular position of the pulse motor 12.

(Stopper mechanism)

Numeral 21 is a rotary solenoid which constiutes a part of a stopper mechanism 20. A stopper plate 23 having a stopper pin 22 is attached to a rotation shaft of the rotary solenoid 21. A groove 24 for engagement with the stopper pin 22 is formed at each distal end of the two arm parts of the rocker arm 13a. When a voltage is applied to the rotary solenoid 21, the stopper plate 23 is rotated so that the stopper pin 22 is moved in a direction away from the rocker arm 13a. In contrast, if no voltage is applied, the stopper plate 23 is returningly rotatated by a spring force of the rotary solenoid 21 and the stopper pin 22 is brought into engagement with the groove 24. By this arrangement, the stopper mechanism 20 fixes the placement bed 2 at two positions, i.e. the initial position and the position where a wafer can be loaded and unloaded.

Numerals 25 and 26 are light shield sensors. The light shield sensor 25 senses a light-shielded state associated with rotation of the stopper plate 23, to thereby detect that the placement bed 2 is released from rotation lock as the stopper pin 22 is disengaged from the groove 24. In contrast, the light shield sensor 26 detects the rotation lock of the placement bed 2 as the groove 24 and the stopper pin 22 engage each other.

The rotation mechanism and the stopper mechanism are moved up and down together relative to the transporter by a loader mechanism 34.

Figure 4:
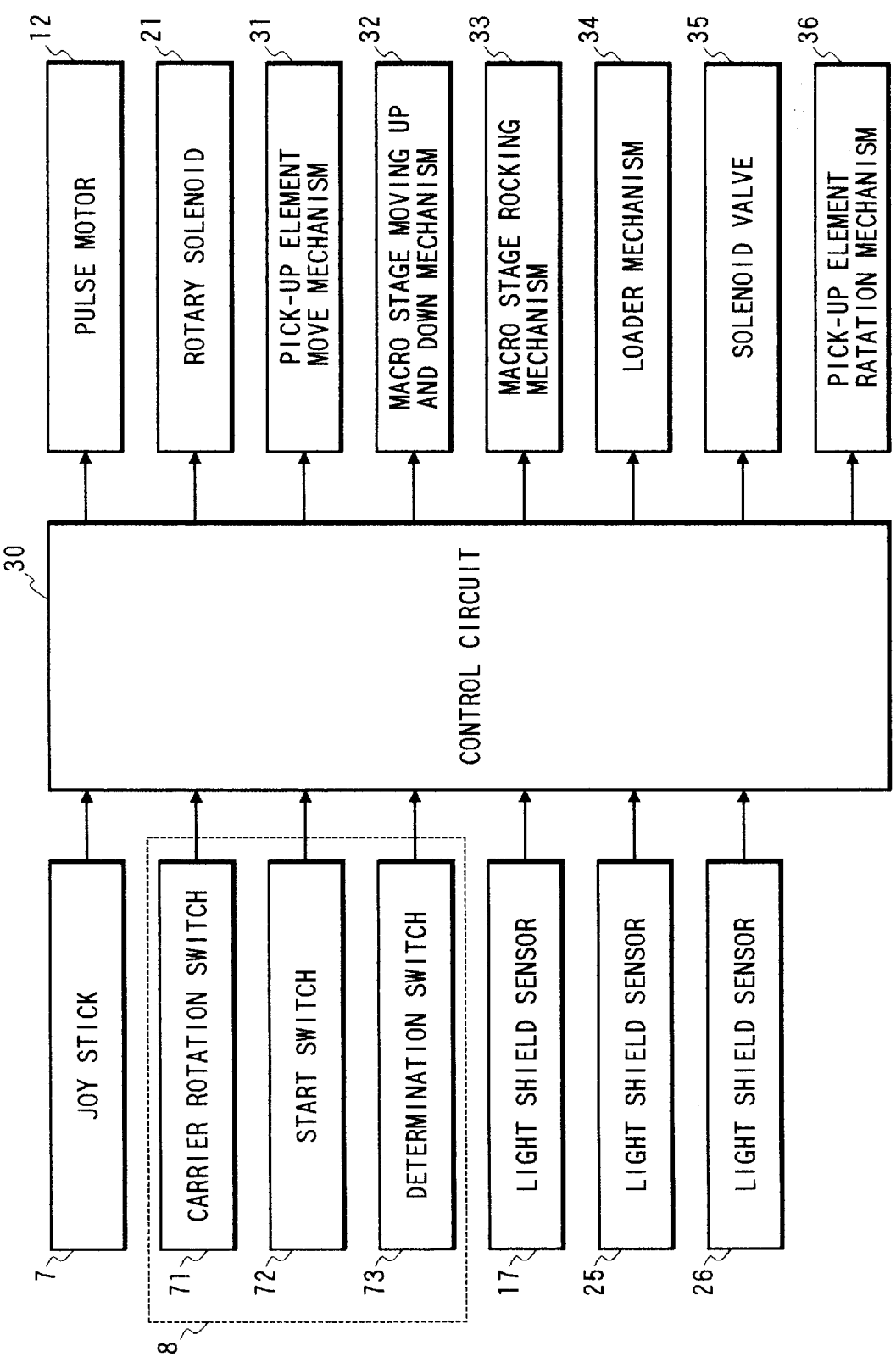
FIG. 4 is a main part block diagram of a control system of the semiconductor wafer transporter of the embodiment.

Next, the operation of the transporter will be discussed with reference to FIG. 4 showing a main part block diagram of a control system.

The examiner confirms whether the placement bed 2 is in the directional state as shown in FIG. 1 (in the initial state, the placement bed 2 is positioned so that the carrier 51 can be placed thereon with the wafer outlet directed away from the operator), and then places the carrier 51 on the placement bed 2 with the wafer outlet directed away from the operator. After the carrier 51 has been on the placement bed 2, the examiner presses a carrier rotation switch 71 on the operation panel 8. The switch signal causes a control circuit 30 to apply a voltage to the rotary solenoid 21, which in turn withdraws the stopper pin 22 from the groove 24 of the rocker arm 13a, so that the placement bed 2 is released from rotation-fixed state. Subsequently, the control circuit 30 gives a predetermined pulse signal to the pulse motor 12 for rotationally driving the motor, which in turn rotates the placement bed 2 at 90 degrees clockwise in FIG. 1 through the link mechanism 13, so that the wafer outlet of the carrier 51 placed on the placement bed 2 is directed toward the transport direction of the pick-up element 4. Thereafter, voltage application to the rotary solenoid 21 is cut and the placement bed 2 is fixed by the stopper mechanism 20 so as not to rotate. A rotation-fixed state of the placement bed 2 is checked by the light shield sensor 26.

When the wafer outlet of the carrier 51 is directed toward the transport direction, the examiner presses a start switch 72 for starting examination. In response to the start switch signal, the control circuit 30 drives a pick-up element move mechanism 31 to move and insert the pick-up element 4 under a wafer stored in the lowermost stage (or a specified stage) of the carrier 51. When the pick-up element 4 is moved to a predetermined position, the control circuit 30 controls a solenoid valve 35 to attract the wafer on the attraction part 4a and transport the wafer above the macro stage 6. When the wafer is positioned above the macro stage 6, the control circuit 30 releases the attraction of the wafer. Next, the control circuit 30 moves the macro stage 6 upward by a macro stage moving up and down mechanism 32. When the macro stage 6 becomes as high as the wafer, the control circuit 30 actuates a solenoid valve communicating to the macro stage 6 to attract the wafer thereon. Then, the macro stage 6 is moved further upward to the height required for examination of the wafer. Then, the examiner operates the joy stick 6 to rock and incline the macro stage 6, and executes macro inspection of the wafer.

Further, when a microscopic examination is required, a pick-up element rotation mechanism 36 is actuated, thereby transporting the wafer attracted on the pick-up element 4 to the microscope 60. The examiner operates the handle 62 to move the wafer attracted on the examination stage 61 to a position below the microscope 60, and executes a microscopic examination of the wafer.

The wafer which has been examined is transported by means of the pick-up element 4 and is restored to the former position in the carrier 51. When the examined wafer has been stored in the carrier 51, the control circuit 30 controls and drives the loader mechanism 34 for moving the placement bed 2 up and down to the position where another wafer to be examined can be attracted on the pick-up element 4.

When the inspection for all wafers (or some sampling wafers) stored in the carrier 51 has been thus performed and the inspection (examination) is complete, the placement bed 2 is moved up to a rotatable position. When the carrier rotation switch 71 is again pressed, the control circuit 30 drives the rotary solenoid 21 to release rotation-fixed state of the placement bed 2. If release of rotation-fixed state is confirmed by the light shield sensor 25, the control circuit 30 controls and drives the pulse motor 12 to rotate the placement bed 2 in the reverse direction, so that the wafer outlet of the carrier 51 is directed away from the operator. Voltage application to the rotary solenoid 21 is cut and the placement bed 2 is fixed by the stopper mechanism 20.

After the wafer outlet of the carrier 51 is directed away from the operator, the examiner lifts up and removes the carrier 51 from the placement bed 2. At this time, the wafer outlet is directed away from the operator, thus if the wafer is large in diameter and heavy in weight, the examiner can hold both side faces of the carrier with both hands, and thus the handling can be made easy. The risk of dropping the wafer is low.

As discussed above, the carrier is placed with the wafer outlet directed away from the operator, and then rotated so that the wafer outlet is directed in a lateral direction. By this arrangement, the transport mechanism of the pick-up element 4, etc., can be placed on the lateral side of the carrier, so that the transport mechanism can be a simple structure and can be kept out of way of examination. Thus, the examiner can place the carrier safely and easily. Since the transport mechanism is simple, the number of parts can be decreased and the transporter is inexpensive to manufacture.

The rotation mechanism of the placement bed is not limited to the link mechanism; the placement bed can also be rotated directly by a motor or via a gear, a belt, or the like. It may be rotated manually in place of an electric rotation mechanism. Further, for the stopper mechanism, rotation can also be fixed with an electromagnet, etc., and various stopper mechanisms can be used.

As we have discussed, according to the invention, the carrier can be installed and removed safely and easily without complicating the transport mechanism.

What is claimed is:

1. A semiconductor wafer transporter comprising transport means for taking out individual wafers from a carrier storing a plurality of semiconductor wafers and transporting the wafers, said semiconductor wafer transporter further comprising:

operation means, located on one side of the transporter, for operating the transporter by an operator;

placement means, including a fixing member, for placing the carrier at a first position where a wafer outlet of the carrier, through which the wafers are taken out by said transport means, faces an opposite side of the transporter from said operation means; and rotating means for rotating said placement means so that the carrier moves at least between said first position and a second position where the wafer outlet of the carrier faces said transport means.

2. The semiconductor wafer transporter as claimed in claim 1, further comprising:

fixing means for preventing rotation of said placement means when the carrier is at said first and second positions.

3. The semiconductor wafer transporter as claimed in claim 2, further comprising:

sensing means for sensing a fixed state in which said placement means is prevented from rotating by said fixing means.

4. The semiconductor wafer transporter as claimed in claim 1, further comprising:

examination means for performing a visual inspection of the wafers, wherein said transport means transfers the wafers to said examination means.

5. The semiconductor wafer transporter as claimed in claim 1, wherein said placement means comprises a rotatable placement bed, and said rotating means comprises a rocker arm, a motor for rotating said rocker arm, and a link mechanism rotatably connected at its opposite ends with said rocker arm and said placement bed.

6. The semiconductor wafer transporter as claimed in claim 5, further comprising a stopper plate having a stopper pin that engages a groove in said rocker arm to prevent rotation of said placement bed.

7. The semiconductor wafer transporter as claimed in claim 6, further comprising a solenoid for automatically rotating said stopper plate in opposite directions so that said stopper pin engages and disengages said groove in said rocker arm.

8. The semiconductor wafer transporter as claimed in claim 5, wherein said rocker arm is substantially L-shaped.

9. The semiconductor wafer transporter as claimed in claim 7, further comprising a first sensor for detecting a position of said rocker arm, a second sensor for detecting when said stopper pin is engaged with said groove, and a third sensor for detecting when said stopper pin is disengaged with said groove.

10. The semiconductor wafer transporter as claimed in claim 6, further comprising a solenoid for automatically rotating said stopper plate in opposite directions so that said stopper pin engages and disengages said groove in said rocker arm, wherein said stopper pin is disengaged from said groove when said placement bed is disposed at a predetermined height.

11. The semiconductor wafer transporter as claimed in claim 1, wherein said rotating means rotates said placement means so that the carrier moves between said first position and said second position at an angle of ninety degrees about an axis of rotation.

12. The semiconductor wafer transporter as claimed in claim 1, wherein said operation means comprises input means for entering a start signal to start rotation of said rotating means, said semiconductor wafer transporter further comprising:

driving means for moving said rotating means; and control means for controlling said driving means based on the start signal entered by operation of said input means.

13. The semiconductor wafer transporter as claimed in claim 12, further comprising fixing means for preventing the rotation of said rotating means when the start signal is not entered by operation of said input means.

14. A semiconductor wafer transporter comprising:

a main unit;

a wafer pick-up element, which is supported on said main unit, for taking out individual wafers from a carrier storing a plurality of semiconductor wafers;

a moving mechanism for moving said wafer pick-up element;

a wafer storage carrier placement bed, which is supported on said main unit, having a fixing member for fixing the carrier;

a rotating mechanism for rotating said wafer storage carrier placement bed;

a controller for controlling said moving mechanism and said rotating mechanism;

an operation panel, which is located on one side of said main unit, having a switch for entering a rotation start signal to said controller; and a stopper mechanism for preventing rotation of said wafer storage carrier placement bed by said rotating mechanism, wherein said wafer storage carrier placement bed having said fixing member places the carrier at a first position where a wafer outlet of the carrier, through which the wafers are taken out by said wafer pick-up element, faces an opposite side of the transporter from the operation panel; said rotating mechanism rotates said wafer storage carrier placement bed to move the carrier between said first position and a second position where the wafer outlet of the carrier faces said wafer pick-up element; and said stopper mechanism prevents the rotation of said wafer storage carrier placement bed, when the rotation start signal is not entered by operation of the switch and the carrier is located at said first and second positions.

* * * * *